United States Patent [19]
Osborne et al.

[11] Patent Number: 5,967,466
[45] Date of Patent: Oct. 19, 1999

[54] BACK PLANE LOCK DOWN

[75] Inventors: Jon Richard Osborne, Wauseon; Conrad A. H. Jelinger, Toledo, both of Ohio

[73] Assignee: Unitrend, Inc., Toledo, Ohio

[21] Appl. No.: 09/146,632

[22] Filed: Sep. 4, 1998

[51] Int. Cl.⁶ .................................................. G12B 9/00
[52] U.S. Cl. .................. 248/27.1; 248/674; 361/726; 361/736; 312/183
[58] Field of Search .................... 248/506, 500, 248/221.11, 27.1, 27.3, 674, 675, 271, 518, 534, 221.12, 220.31, 222.14, 223.31; 361/736, 726, 737, 748, 751, 752, 753, 759, 760, 815, 829, 724, 725; 312/183; 174/35 GC

[56] References Cited

U.S. PATENT DOCUMENTS

| | | | |
|---|---|---|---|
| 3,878,438 | 4/1975 | Weisman | 317/101 DH |
| 3,899,721 | 8/1975 | Borchard et al. | 317/101 DH |
| 4,002,381 | 1/1977 | Wagner et al. | 312/183 |
| 4,227,238 | 10/1980 | Saito | 361/145 |
| 4,472,765 | 9/1984 | Hughes | 361/413 |
| 4,744,006 | 5/1988 | Duffield | 361/413 |
| 4,873,395 | 10/1989 | Mast | 174/35 GC |
| 5,004,867 | 4/1991 | Mast | 174/35 GC |
| 5,099,391 | 3/1992 | Maggelet et al. | 361/395 |
| 5,264,986 | 11/1993 | Ohgami et al. | 361/740 |
| 5,317,483 | 5/1994 | Swindler | 361/801 |
| 5,366,185 | 11/1994 | Michael et al. | 248/27.1 |
| 5,398,156 | 3/1995 | Steffes et al. | 361/683 |
| 5,428,507 | 6/1995 | Chatel et al. | 361/798 |
| 5,465,927 | 11/1995 | Chun-Jung | 248/271 |
| 5,483,420 | 1/1996 | Schiavini | 361/707 |
| 5,513,069 | 4/1996 | Ohgami et al. | 361/685 |
| 5,575,546 | 11/1996 | Radloff | 312/183 |
| 5,617,296 | 4/1997 | Melville et al. | 361/736 |
| 5,701,231 | 12/1997 | Do et al. | 361/683 |
| 5,748,449 | 5/1998 | Tahmassebpur | 361/753 |

*Primary Examiner*—Derek J. Berger
*Assistant Examiner*—Tan Le
*Attorney, Agent, or Firm*—MacMillan, Sobanski & Todd, LLC

[57] ABSTRACT

A back plane lock down for fastening one or more circuit boards and/or cover plates to the back plane of a computer chassis. The back plane lock down is made of non-electrically conducting material such that the computer need not be powered down when fastening the circuit boards and/or cover plates to the back plane. The back plane lock down includes one or more sections that can be pivotally connected together by using a bracket for accommodating a wide variety of back plane configurations. Each section includes one or more tabs disposed within openings formed by ribs. Each tab includes a downwardly extending projection for insertion into an opening in the back plane to easily fasten each circuit board and cover plate to the back plane without the need for tools.

8 Claims, 3 Drawing Sheets

BACK PLANE LOCK DOWN

BACKGROUND OF THE INVENTION

This invention relates in general to computer hardware, and in particular, to securing circuit boards or cover plates to a back plane of a computer chassis.

A lock down is used to secure a computer circuit board, for example, a modem card or sound card, or cover plate to the back plane of a computer chassis. Typically, the lock down is made of metal and requires a screw or other means for fastening the circuit board in place. However, this practice requires that the computer power be turned off in order to avoid risk of electrical shock to the technician and/or damage to the computer. Therefore, it would be desirable to provide a lock down that fastens one or more circuit boards and/or cover plates in place without using tools and without the need to power down the computer.

SUMMARY OF THE INVENTION

It is an object of the invention to provide a back plane lock down that fastens one or more circuit boards and/or cover plates to a back plane of a computer chassis without the need for tools.

It is another object of the invention to provide a back plane lock down that fastens one or more circuit boards and/or cover plates to a back plane of a computer chassis without the need to power down the computer.

It is yet another object of the invention to provide a back plane lock down that can easily be adapted to a back plane having any number of slots for the circuit boards and/or cover plates by pivotally connecting together one or more sections of the back plane lock down.

To achieve these and other objects, the back plane lock down comprises a first section having side walls and end walls. The first section includes at least one rib extending between the side walls forming an opening, and at least one tab extending outwardly within the opening. The at least one tab includes a projection capable of being received within a first opening of the back plane to fasten the at least one component to the back plane of the computer chassis.

Additional sections may be added depending on the number of slots on the back plane of the computer chassis. For example, the back plane lock down may also include a second section pivotally connected to the first section by using a bracket. Similar to the first section, the second section may include at least one rib extending between the side walls forming an opening, and at least one tab extending outwardly within the opening. The at least one tab includes a projection capable of being received within a first opening of the back plane to fasten a different component to the back plane of the computer chassis.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
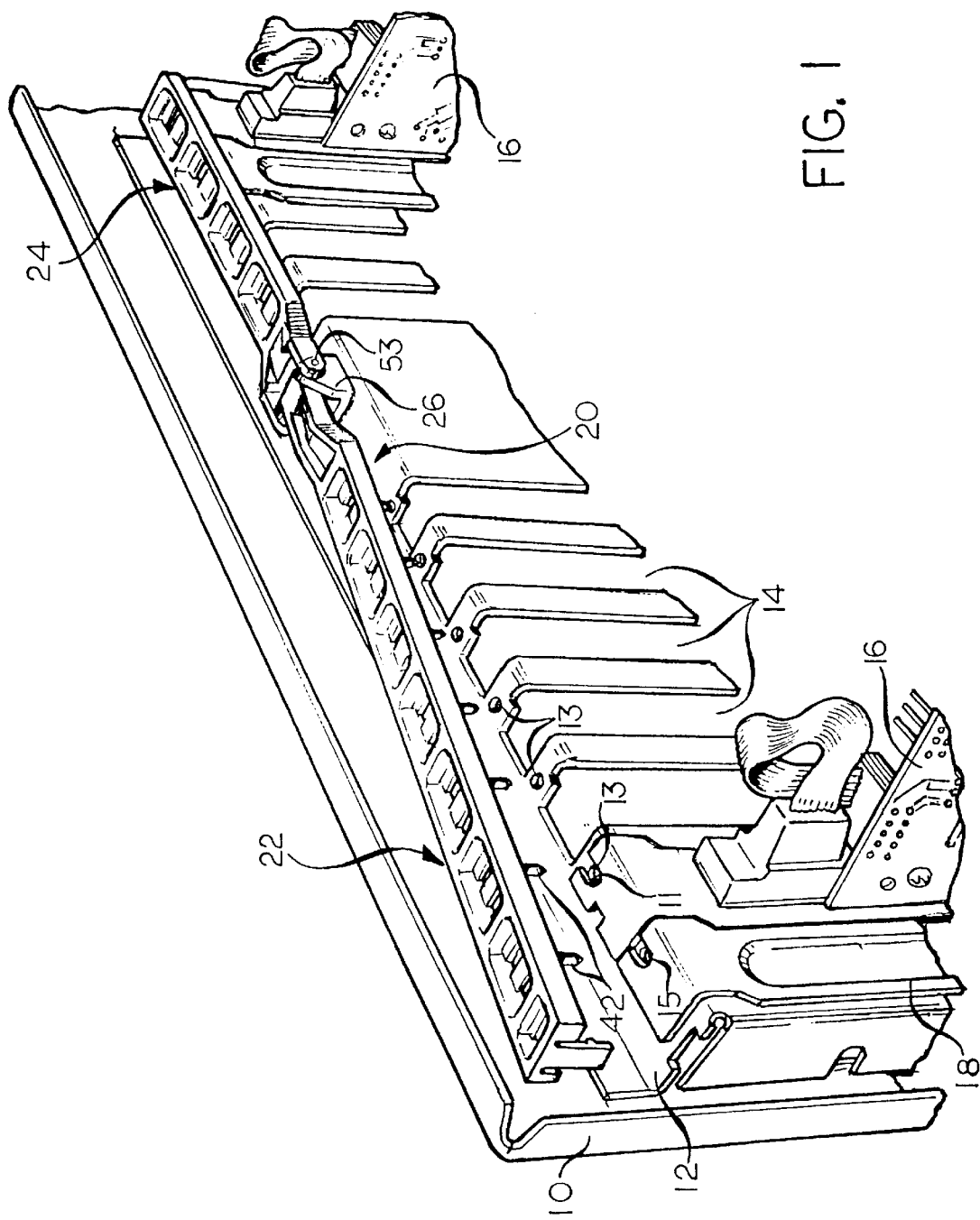
FIG. 1 is partial cutaway side perspective view of the back plane lock down according to a preferred embodiment of the invention when partially installed in the back plane of the main computer chassis.

Typically, a main computer chassis 10 includes a back plane 12 having a plurality of slots 14 for receiving computer components, such as one or more circuit boards 16 and/or cover plates 18, and the like. Typically, each circuit board 16 is connected to the computer by inserting one end of the circuit board 16 into a slot (not shown) usually located at a bottom section of the computer. Then, a slotted opening 11 on the circuit board is aligned with a corresponding opening 13 on the back plane 12 and secured to the back plane 12 by using a threaded fastener, such as a metal screw. Similarly, a slotted opening 15 on each cover plate 18 is aligned with a corresponding opening 13 on the back plane 12 and secured to the back plane 12 by using a threaded fastener, such as a metal screw.

Referring now to the drawings, there is illustrated in FIG. 1, a back plane lock down, shown generally at 20, according to a first preferred embodiment of the invention for securing each circuit board 16 and cover plate 18 to the back plane 12 of the main computer chassis 10. The back plane lock down 20 is preferably made of 101L Nylon material, but it should be understood that it can be made of any suitable electrically non-conductive material, such as plastic, and the like.

The back plane lock down 20 includes a first section, shown generally at 22. If necessary, the back plane lock down 20 may also include a second section, shown generally at 24, for accommodating a main computer chassis 10 having additional circuit boards 16 and cover plates 18 than the capacity of the first section 22. When the second section 24 is required, a bracket 26 may be provided to pivotally connect the first section 22 to the second section 24, as shown in FIG. 1.

Figure 2:
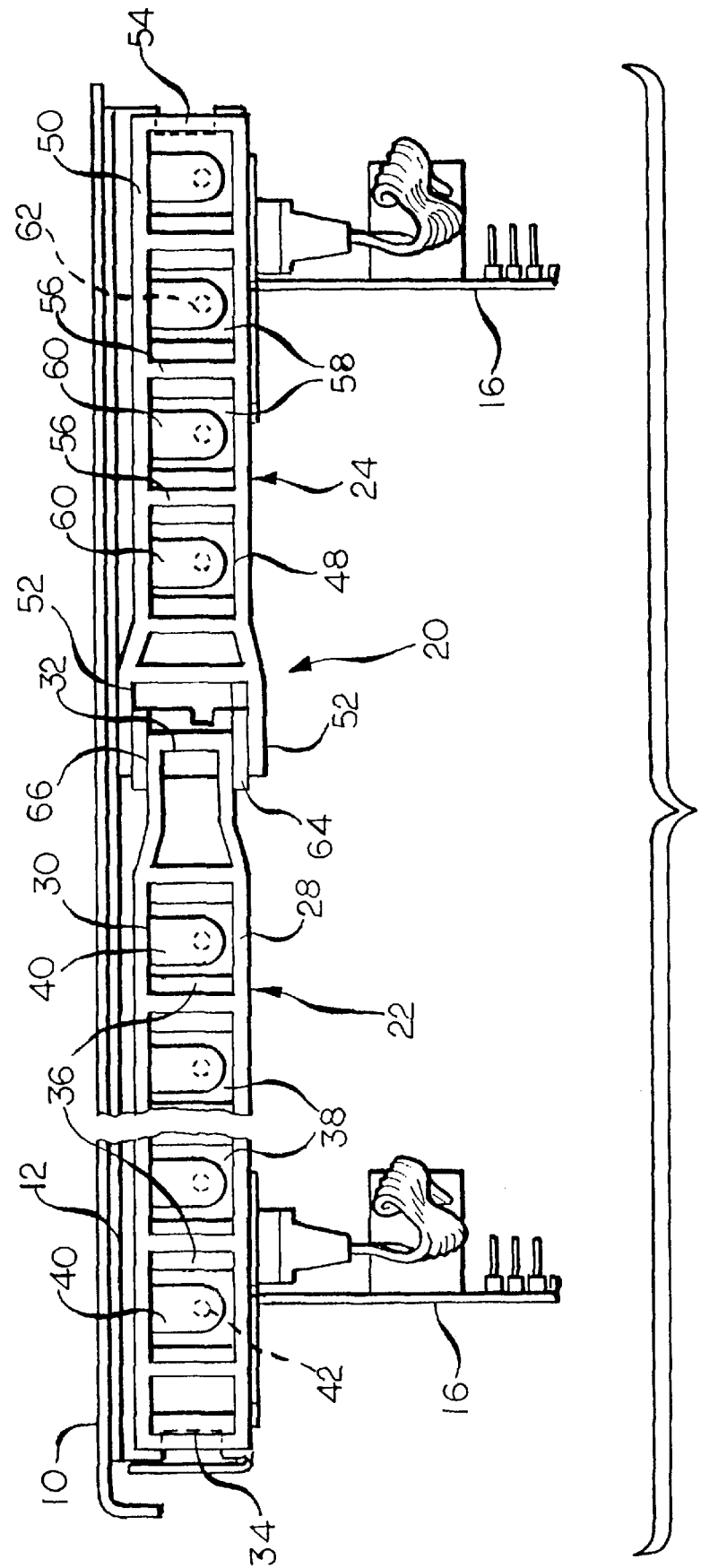
FIG. 2 is a top view of the back plane lock down of the preferred embodiment of the invention when installed in the back plane of the main computer chassis.

As best seen in FIG. 2, the first section 22 includes a pair of substantially side walls 28, 30 along substantially the length of the first section 22. At one end of the first section 22, the side walls 28, 30 taper and terminate at an end wall 32. At the other end of the first section 22, the side wall 28, 30 terminate at an end wall 34. The first section 22 also includes a plurality of ribs 36 for structurally supporting the side walls 28, 30 and forming a opening 38 therebetween. In the preferred embodiment, the thickness of the side walls 28, 30, the end walls 32, 34 and the ribs 36 is approximately 0.09 inches. However, it should be realized that the thickness of the side walls 28, 30, the end walls 32, 34 and the ribs 36 may be any suitable thickness to provide structural integrity to the first section 22.

The first section 22 may include one or more generally U-shaped tabs 40 disposed within the openings 38 formed by the ribs 36. In the preferred embodiment, eight (8) tabs 40 are provided in the first section 22 to accommodate eight (8) openings 13 in the back plane 12. If the back plane 12 has a total of twelve (12) openings 13 in the back plane 12, the second section 24 may include four (4) tabs 40 to accommodate the additional four (4) openings 13 in the back plane 12. It should be realized that the invention in not limited to the number of tabs 40 in the first and second sections 22, 24, and that the invention can be practiced with any suitable number of tabs 40 in either the first and second sections 22, 24 in order to accommodate the appropriate number of openings 13 in the back plane 12. Preferably, each tab 40 should have a width and a thickness such that it can readily flex in the vertical direction when an appropriate amount of force is applied to the tab 40. In the preferred embodiment, each tab 40 has a width of approximately 0.280 inches and a thickness of approximately 0.09 inches. However, each tab 40 may have any suitable width and thickness to provide the appropriate amount of flex when force is applied.

Figure 3:
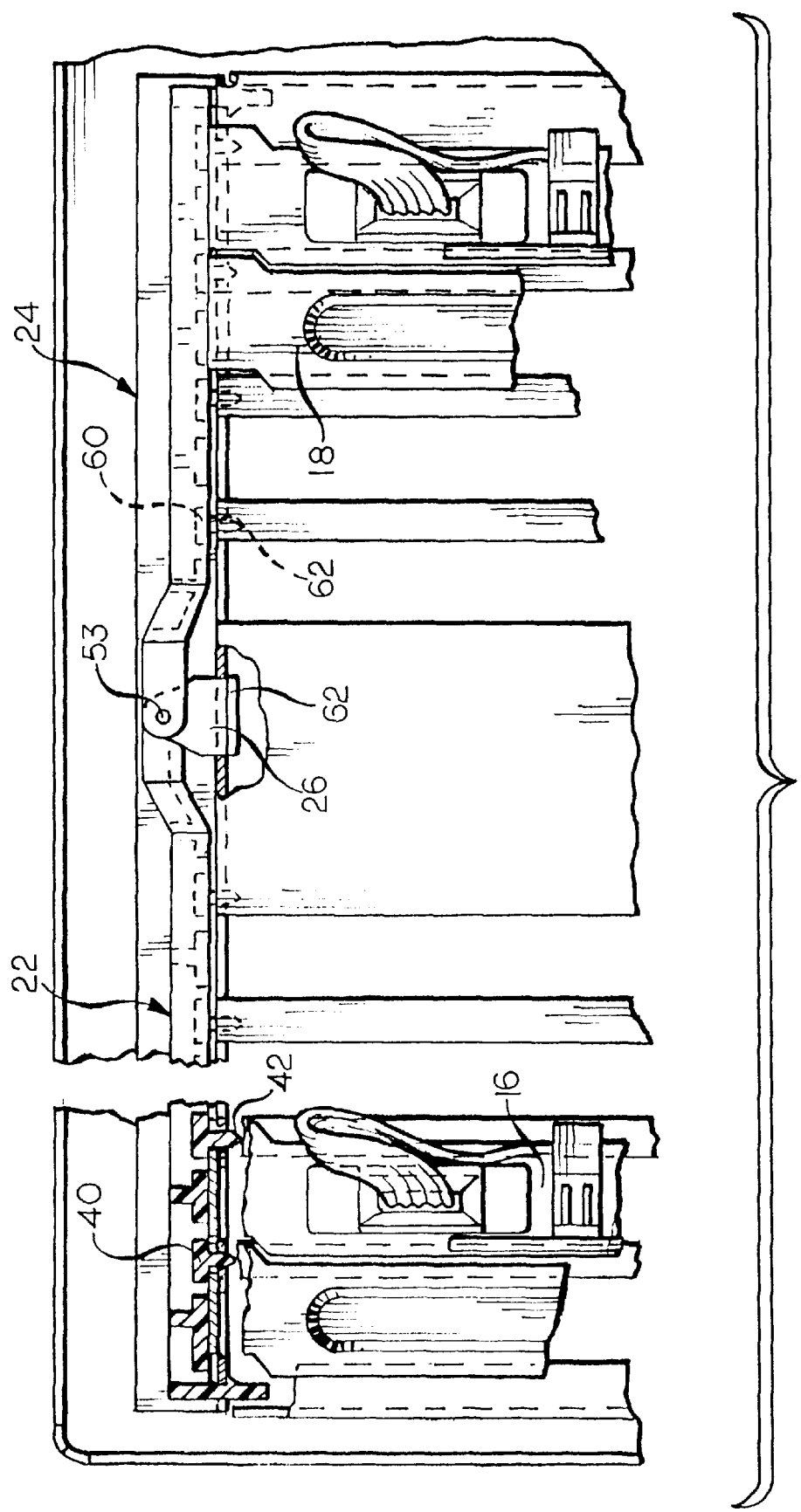
FIG. 3 is a side view of the back place lock down of the preferred embodiment of the invention when installed in the back plane of the main computer chassis.

One end of each tab 40 may be integrally formed with one of the side walls 28, 30 and extend outwardly therefrom. At the other end of each tab 40, a downwardly extending projection 42 is provided. In the preferred embodiment, each of the projections 42 are substantially cylindrical in shape. However, it should be realized that the projections 42 can be any complimentary shape that is capable of being received in a corresponding opening 13 of the back plane 12. Preferably, the cylindrical portion of each projection 42 has an outer diameter of approximately 0.100 inches. To facilitate insertion into the opening 13, each of the projections 42 may include a tapered end portion, as best shown in FIG. 3.

Each projection 42 should be spaced apart from each other such that each projection 42 can be received in a corresponding opening 13 of the back plane 12. In the preferred embodiment, the projections 42 are spaced apart approximately 0.813 inches from each other. However, it should be realized that the spacing of each of the projections 42 can be varied depending on the type of main computer chassis 10 and that the invention can be practiced with a different spacing between each of the projections 42.

The second section 24 is substantially identical to the first section 22. Similar to the first section 22, the second section 24 includes a pair of substantially side walls 48, 50 along substantially the length of the second section 24. As best seen in FIG. 2, at one end of the second section 24, the side walls 48, 50 flare outwardly to form an end portion 52 having a sufficient width such that the tapered end 32 of the first section 22 can be received between the side walls 48, 50 of the second section 24. Each side wall 48, 50 of the end portion 52 may include a pin or post 53. Preferably, each post 53 is formed integrally with each side wall 48, 50. Each post 53 may have a sufficient length such that each post 53 can pass through openings on each side of the end portion 52 of the second section 24, the bracket 26, and the tapered side walls 28, 30 of the first section 22 in order to pivotally connect the first section 22 to the second section 24. Alternatively, a single pin or post having a sufficient length to pass through both sides of the end portion 52, both sides walls 28, 30, and the bracket 26.

At the other end of the second section 24, the side wall 48, 50 terminates at an end wall 54. Similar to the first section 22, the second section 24 also includes a plurality of ribs 56 for structurally supporting the side walls 48, 50 and one or more generally U-shaped tabs 60 disposed within the openings 58 formed by the ribs 56. Also similar to the first section, the second section 24 also includes a projection 62 extending downwardly from each tab 60. Preferably, the thickness of the side walls 48, 50, the end wall 54, and the ribs 56 is approximately 0.09 inches, as in the first section 22. However, it should be realized that the thickness of the side walls 28, 30, the end walls 32, 34 and the ribs 36 may be any suitable thickness to provide structural integrity to the first section 22.

It should be also realized that the thickness and geometrical configuration of the second section 24 may be not substantially identical to the first section 22 depending on the number of slots 14 in the back plane 12 of the main computer chassis 10. For example, the second section 24 may be different than the first section 22 for an IBM AT back plane than it would be for an IBM AT/ATX back plane, and the like.

As mentioned above, two or more sections 22, 24 may be pivotally connected or linked together using the bracket 26. The bracket 26 includes a base 62 that may be attached to the back plane 12 using any suitable means, such as snaps, clips, and the like. The bracket 26 also includes a pair of upright members 64, 66 extending substantially perpendicular to the base 62. Each upright member 64, 66 includes an opening capable of receiving each post 53 of the second section 24. The upright members 64, 66 are spaced apart a predetermined distance such that the tapered end 32 of the first section 22 can be received between the upright members 64, 66, as shown in FIG. 2. Similarly, the upright members 64, 66 are capable of being received between the flared side walls 52 of the second section 24. Thus, the upright members 64, 66 are preferably disposed between the side walls 28, 30 of the first section 22 and the side walls 48, 50 of the second section 24. However, it should be realized that other juxtapositions between the side walls 28, 30, the side walls 48, 50 and the upright members 64, 66 are envisioned and are well within the scope of the invention.

As seen in FIG. 3, the height of the upright members 64, 66 are such that the opening in the end portion 32 of the first section 22 and the opening in the upright members 64, 66 of the bracket 26 are aligned with each post 53 when the back plane lock down 20 of the invention is installed in the back plane 12 of the main computer chassis 10.

To install the back plane lock down 20 for fastening one or more circuit boards 16 and cover plates 18 to the back plane 12 of the main computer chassis 10, the computer technician first installs the necessary circuit boards 16 and cover plates 18 to the computer such that the slots 11, 15 are aligned with the openings 13 on the back plane 12. Then, the technician determines the appropriate number of sections of the back plane lock down 20 needed depending on the type of back plane 12. For example, the computer technician might determine that the first and second sections 22, 24 of the back plane lock down 20 need to be installed to the computer. To do so, the computer technician first attaches the second section 24 by inserting each of the projections 42 into the openings 13 in the back plane 12 to snap the second section 24 in place.

Then, the openings on the tapered end 32 of the first section 22 and the openings on the upright members 64, 66 of the bracket 26 are aligned with each other and then each post 53 is received in the respective openings so as to pivotally connected the first section 22 to the second section 24. Then, the base 62 of the bracket can be snapped into place on the back plane 12 of the main computer chassis 10. At this point, the back plane lock down 20 is installed as shown in FIG. 1.

Next, the projections 42 on the first section 22 are inserted into the openings 13 on the back plane 12 of the main computer chassis 10 to snap the first section 22 in place. After all the projections 42 are received in the openings 13, the back plane lock down 20 has fastened the circuit boards 16 and cover plates 18 to the back plane 12 of the main computer chassis 10. To remove the back plane lock down 20, the reverse of the above steps are performed.

It should be appreciated that the back plane lock down 20 of the invention quickly and easily fastens the circuit boards 16 and the cover plates 18 to the back plane 12 without the use of tools. Further, the back plane lock down 20 fastens the circuit boards 16 and the cover plates 18 without the need to power down the computer because the back plane lock down of the invention is made of non-electrically conductive material.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A back plane lock down for fastening at least one component to a back plane of a computer chassis, said back plane lock down comprising a first section having side walls and end walls, said first section including at least one rib extending between the side walls forming an opening, and at least one tab extending outwardly within the opening, the at least one tab including a projection capable of being received within a first opening of the back plane to fasten the at least one component to the back plane of the computer chassis.

2. The back plane lock down according to claim 1, further including a second section pivotally connected to said first section.

3. The back plane lock down according to claim 2, further including a bracket for pivotally connecting said first section to said second section.

4. The back plane lock down according to claim 2, wherein said second section includes side walls and end walls, and including at least one rib extending between the side walls forming an opening, and further including at least one tab extending outwardly within the opening, the at least one tab including a projection capable of being received within a second opening of the back plane to fasten a different component to the back plane of the computer chassis.

5. The back plane lock down according to claim 4, wherein said first section has a different number of projections than said second section.

6. The back plane lock down according to claim 1, wherein said first section is made of a non-electrically conductive material for allowing said first section to fasten the at least one component to the computer chassis while the computer chassis is being supplied with electrical current.

7. A back plane lock down for fastening at least one component to a back plane of a computer chassis, said back plane lock down comprising a plurality of sections, each section having side walls and end walls, and including at least one rib extending between the side walls forming an opening, and at least one tab extending outwardly within the opening, the at least one tab including a first projection capable of being received within an opening of the back plane to fasten the at least one component to the back plane of the computer chassis.

8. The back plane lock down according to claim 7, further including a bracket for pivotally connecting said plurality of sections to each other.

\* \* \* \* \*